(12) United States Patent
Corisis et al.

(10) Patent No.: US 7,183,138 B2
(45) Date of Patent: Feb. 27, 2007

(54) METHOD AND APPARATUS FOR DECOUPLING CONDUCTIVE PORTIONS OF A MICROELECTRONIC DEVICE PACKAGE

(75) Inventors: David J. Corisis, Nampa, ID (US); Aaron M. Schoenfeld, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 756 days.

(21) Appl. No.: 10/393,376

(22) Filed: Mar. 19, 2003

(65) Prior Publication Data

US 2005/0250251 A1    Nov. 10, 2005

Related U.S. Application Data

(63) Continuation of application No. 09/644,476, filed on Aug. 23, 2000, now abandoned.

(51) Int. Cl.
*H01L 21/44* (2006.01)
*H01L 21/48* (2006.01)
*H01L 21/50* (2006.01)

(52) U.S. Cl. ............... 438/118; 438/123; 438/124; 438/125; 438/126

(58) Field of Classification Search ............... 438/118, 438/123, 124, 125, 126
See application file for complete search history.

(56) References Cited

U.S. PATENT DOCUMENTS

| | | | |
|---|---|---|---|
| 5,062,565 A | 11/1991 | Wood et al. | |
| 5,086,018 A | 2/1992 | Conru et al. | |
| 5,145,099 A | 9/1992 | Wood et al. | |
| 5,434,357 A | 7/1995 | Belcher et al. | |
| 5,569,625 A | 10/1996 | Yoneda et al. | |
| 5,654,877 A | 8/1997 | Burns | |
| 5,677,566 A | 10/1997 | King et al. | |
| 5,701,035 A | 12/1997 | Teraguchi | |
| 5,826,628 A | 10/1998 | Hamilton | |
| 5,879,965 A | 3/1999 | Jiang et al. | |
| 5,904,500 A | 5/1999 | Tay | |
| 5,932,345 A | 8/1999 | Furutani et al. | |
| 5,986,209 A | 11/1999 | Tandy | |
| RE36,469 E | 12/1999 | Wood et al. | |
| 6,013,535 A | 1/2000 | Moden et al. | |
| 6,025,728 A | 2/2000 | Hembree et al. | |
| 6,048,744 A | 4/2000 | Corisis et al. | |

(Continued)

OTHER PUBLICATIONS

Webster's II New College Dictionary, Houghton Mifflin Company, 1995, p. 1133, ISBN 0-395-70869-9.

(Continued)

*Primary Examiner*—David E. Graybill
(74) *Attorney, Agent, or Firm*—Perkins Coie LLP

(57) ABSTRACT

A method and apparatus for decoupling conductive portions of a microelectronic device package. In one embodiment, the package can include a microelectronic substrate and a conductive member positioned at least proximate to the microelectronic substrate. The conductive member can have first and second neighboring conductive portions with at least a part of the first conductive portions spaced apart from a part of the neighboring second conductive portion to define an intermediate region between the first and second conductive portions. Each conductive portion has a bond region electrically coupled to the microelectronic substrate. A dielectric material is positioned adjacent to the first and second conductive portions in the intermediate region and has a dielectric constant of less than about 3.5.

21 Claims, 4 Drawing Sheets

U.S. PATENT DOCUMENTS

| | | |
|---|---|---|
| 6,103,547 A | 8/2000 | Corisis et al. |
| 6,130,474 A | 10/2000 | Corisis |
| 6,133,068 A | 10/2000 | Kinsman |
| 6,133,622 A | 10/2000 | Corisis et al. |
| 6,148,509 A | 11/2000 | Schoenfeld et al. |
| 6,150,710 A | 11/2000 | Corisis |
| 6,153,924 A | 11/2000 | Kinsman |
| 6,159,764 A | 12/2000 | Kinsman et al. |
| 6,225,689 B1 | 5/2001 | Moden et al. |
| 6,228,548 B1 | 5/2001 | King et al. |
| 6,229,202 B1 | 5/2001 | Corisis |
| 6,239,489 B1 | 5/2001 | Jiang |
| 6,246,108 B1 | 6/2001 | Corisis et al. |
| 6,246,110 B1 | 6/2001 | Kinsman et al. |
| 6,247,629 B1 | 6/2001 | Jacobson et al. |
| 6,258,623 B1 | 7/2001 | Moden et al. |
| 6,258,624 B1 | 7/2001 | Corisis |
| 6,259,153 B1 | 7/2001 | Corisis |
| 6,261,865 B1 | 7/2001 | Akram |
| 6,271,580 B1 | 8/2001 | Corisis |
| 6,284,571 B1 | 9/2001 | Corisis et al. |
| 6,291,894 B1 | 9/2001 | Farnworth et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,329,705 B1 | 12/2001 | Ahmad |
| 6,331,448 B1 | 12/2001 | Ahmad |
| 6,335,225 B1 | 1/2002 | Doan |
| 6,344,976 B1 | 2/2002 | Schoenfeld et al. |
| 6,346,152 B1 | 2/2002 | Moden et al. |

OTHER PUBLICATIONS

TechTarget, "dialectric constant—a whatis definition," 2 pages. Retrieved from the Internet on Jun. 7, 2002. URL: <http://whatis.techtarget.com/definition/0,,sid9_gci548179,00.html>.

E.I. du Pont de Nemours and Company, "DuPont Flexible Circuit Materials, DuPont™ Pyralux® PC 1000 Flexible Composites," 5 pages. Retrieved from the Internet on Jun. 12, 2002. URL: <http://www.dupont.com/fcm/products/H-46866.html>.

Micron Technology, Inc., Delivery Specification 511-14-00-0323(07), "Delivery Specification of CEL-9200 MC-U," 3 pages, Feb. 26, 1997.

Goodfellow Corporation, "Material Information, Polytetrafluoroethylene, PTFE," 3 pages. Retrieved from the Internet on Nov. 21, 2002. URL: <http://www.goodfellow.com/csp/active/static/A/FP30.HTML>.

METHOD AND APPARATUS FOR DECOUPLING CONDUCTIVE PORTIONS OF A MICROELECTRONIC DEVICE PACKAGE

CROSS-REFERENCE TO RELATED APPLICATION

This application is a continuation of U.S. patent application Ser. No. 09/644,476, filed on Aug. 23, 2000 now abandoned, and entitled "METHOD AND APPARATUS FOR DECOUPLING CONDUCTIVE PORTIONS OF A MICROELECTRONIC DEVICE PACKAGE," which application is hereby incorporated by reference in its entirety.

TECHNICAL FIELD

This invention relates to methods and apparatuses for decoupling conductive portions of a microelectronic device package.

BACKGROUND OF THE INVENTION

Packaged microelectronic assemblies, such as memory chips and microprocessor chips, typically include a microelectronic device mounted to a substrate and encased in a plastic protective covering. The device includes functional features, such as memory cells, processor circuits, and interconnecting circuitry. The device also typically includes bond pads electrically coupled to the functional features. The bond pads are coupled to pins or other types of terminals that extend outside the protective covering for connecting the microelectronic device to buses, circuits and/or other microelectronic assemblies.

In one conventional arrangement shown in FIG. 1, a device package 20 includes a microelectronic die 50 having bond pads 51 positioned along two central axes. A conductive leadframe 30 having conductive leadfingers 31 connected by an outer rim 38 is positioned over the die 50. The leadfingers 31 are separated from the top surface of the die 20 by an insulating layer 60 on the bottom of the leadframe 30. The leadfingers 31 are electrically coupled to the corresponding bond pads 51 with wire bonds 40, and the die 50 and the leadframe 30 are encapsulated with an encapsulating material 21 (the outer periphery of the encapsulating material 21 is shown in phantom lines in FIG. 1). The leadframe 30 is then trimmed along cut lines 33 and the portions of the leadfingers 31 projecting outwardly from the encapsulating material 21 are bent to form pins or other electrically conductive connectors configured to couple the package 20 to other devices or circuit elements.

Devices such as the package 20 described above with reference to FIG. 1 are typically used in compact electronic products, such as laptop computers and mobile telephones. As these electronic products are made more compact, the dies 50 and the packages 20 are also made more compact. One result of this trend is that the spacing between adjacent leadfingers 31 decreases. One problem with this result is that the signals transmitted along adjacent leadfingers 31 can become capacitively coupled. The capacitive coupling can cause signal errors in one or both of the adjacent leadfingers 31, which can adversely affect the performance and reliability of the electronic products into which the packages 20 are incorporated.

SUMMARY

The present invention is directed toward methods and apparatuses for decoupling conductive portions of a microelectronic device package. A method in accordance with one aspect of the invention includes positioning a conductive member at least proximate to a microelectronic substrate. The conductive member can include a leadframe or traces of a printed circuit board and can have first and second neighboring conductive portions with at least part of the first conductive portion separated from the neighboring second conductive portion to define an intermediate region between the two portions. The method can further include electrically coupling the first conductive portion to a first coupling site of the microelectronic substrate and electrically coupling the second conductive portion to a second coupling site of the microelectronic substrate. The method can still further include providing a dielectric material in the intermediate region between the conductive portions with the dielectric material having a dielectric constant of less than about 3.5.

The invention is also directed toward a conductive structure for coupling to a microelectronic substrate. The structure can include a conductive member having first and second conductive portions with at least a part of the first conductive portion being spaced apart from a neighboring part of the second conductive portion to define an intermediate region between the first and second conductive portions. Each conductive portion has a bond region positioned to electrically couple to a microelectronic substrate when the conductive member is positioned at least approximate to the microelectronic substrate. The structure can further include a dielectric material adjacent to the first and second conductive portions and having a dielectric constant of less than about 3.5. The dielectric material can include a pliable material positioned adjacent to opposite surfaces of the conductive portions and can be squeezed into the intermediate region between the conductive portions where the dielectric material can fill all or part of the intermediate region.

DETAILED DESCRIPTION

The present disclosure describes packaged microelectronic devices and methods for packaging such devices. Many specific details of certain embodiments of the invention are set forth in the following description and in FIGS. 2–7 to provide a thorough understanding of these embodiments. One skilled in the art, however, will understand that the present invention may have additional embodiments, or that the invention may be practiced without several of the details described below.

Figure 2:
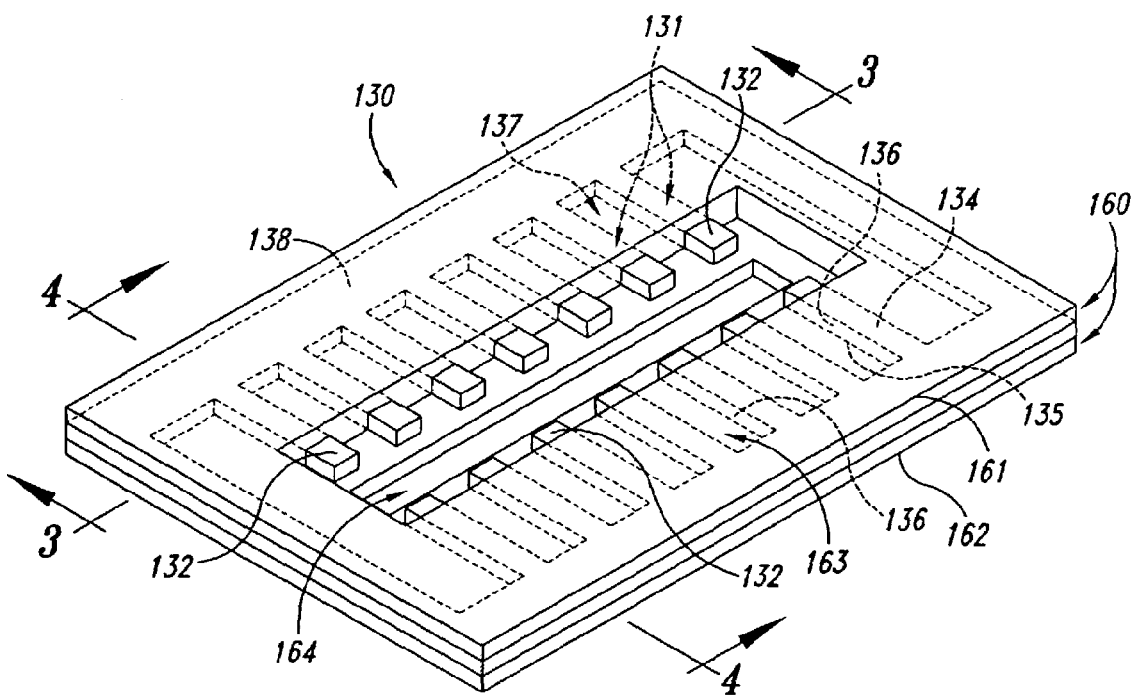
FIG. 2 is a top isometric view of a conductive member and a dielectric material configured in accordance with an embodiment of the invention.

FIG. 2 is a top isometric view of a conductive member 130 (such as a leadframe) having conductive portions 131 (such as leadfingers) and a dielectric material 160 for controlling capacitive coupling between the conductive portions 131. In one aspect of this embodiment, each conductive portion 131 is initially supported in a fixed position relative to its neighbors by a connection portion 138 that forms a frame around the conductive portions 131. Accordingly, neighboring conductive portions 131 are separated from each other by an intermediate region 137. Each conductive portion 131 has an upper surface 134, a lower surface 135 opposite the upper surface 134, and a side surface 136 between the upper surface 134 and the lower surface 135. Each conductive portion 131 also has a bond region 132 spaced apart from the connecting portion 138 for coupling to a microelectronic substrate, as will be described in greater detail below with reference to FIG. 4.

In one aspect of an embodiment shown in FIG. 2, the dielectric material 160 can include an upper portion 161 adjacent to the upper surfaces 134 of the conductive portions 131, a lower portion 162 adjacent to the lower surfaces 135 of the conductive portions 131, and an intermediate portion 163 adjacent to the side surfaces 136 of the conductive portions 131 in the intermediate regions 137 between neighboring conductive portions 131. In an further aspect of this embodiment, the upper portions 161 of the dielectric material 160 do not cover the bond regions 132 of the conductive portions 131, so that electrical connections can be easily made with the bond regions 132. Alternatively, the dielectric material 160 can be initially disposed on the bond regions 132 and then removed, for example by etching, laser ablation, or other processes, before coupling the conductive member 130 to a microelectronic substrate. In still a further aspect of this embodiment, the dielectric material 160 can have an aperture 164 that extends entirely through the dielectric material 160 near the bond regions 132. Accordingly, the aperture 164 can accommodate wire bonds or other connecting structures attached to the bond regions 132, as will be described in greater detail below with reference to FIG. 4.

Figure 3:
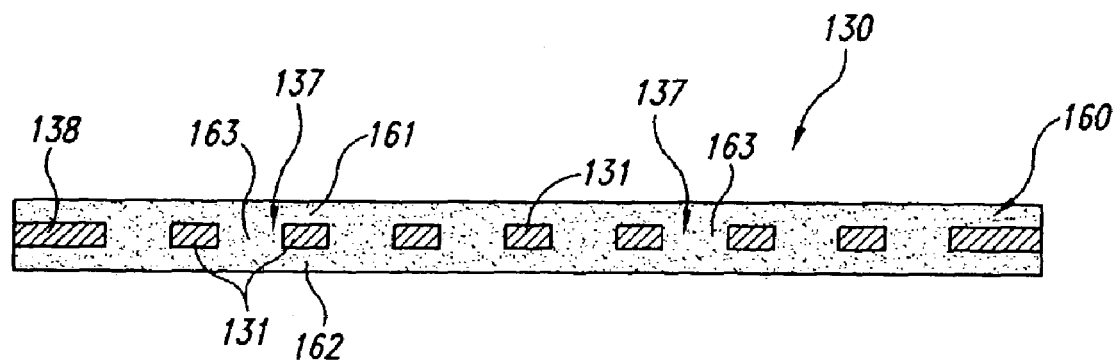
FIG. 3 is a cross-sectional side view of an embodiment of the conductive member shown in FIG. 2 taken substantially along line 3—3.

FIG. 3 is a cross-sectional, side view of an embodiment of the conductive member 130 taken substantially along line 3—3 of FIG. 2. In one aspect of this embodiment, the intermediate portions 163 of the dielectric material 160 completely fill the intermediate regions 137 between neighboring conductive portions 131. In an alternate embodiment, the dielectric material 160 in the intermediate regions 137 can have gaps or voids, as will be described in greater detail below with reference to FIG. 5B.

Figure 4:
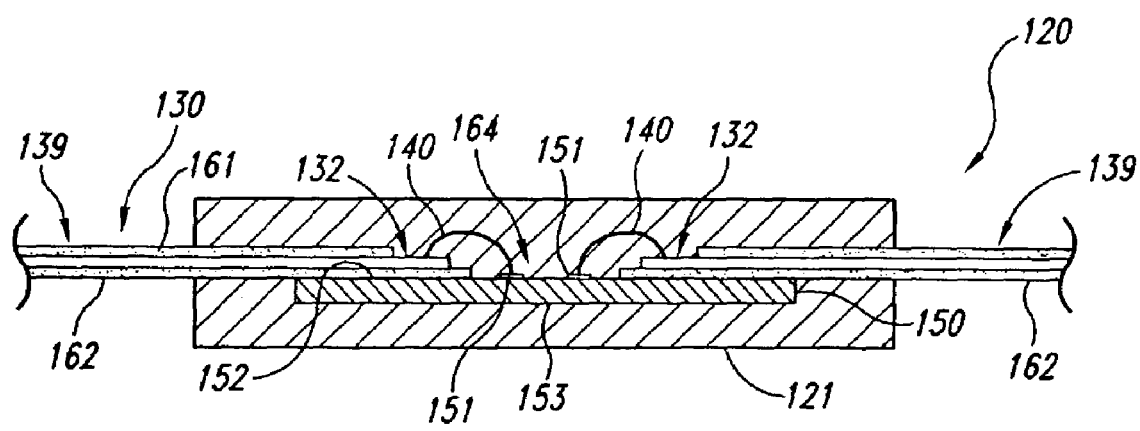
FIG. 4 is a cross-sectional end view of an embodiment of the conductive member shown in FIG. 2 taken substantially along line 4—4, with the conductive member mounted to a microelectronic substrate in accordance with an embodiment of the invention.

FIG. 4 is a cross-sectional end view of an embodiment of the conductive member 130 taken substantially along line 4—4 of FIG. 2. The conductive member 130 is mounted to a microelectronic substrate 150 in accordance with an embodiment of the invention. In one aspect of this embodiment, the microelectronic substrate 150 has a first surface 153, a second surface 152 facing opposite the first surface 153, and a plurality of bond pads 151 or other bond sites on the second surface 152. The bond pads 151 are connected to integrated circuitry in the microelectronic substrate 150.

In one aspect of the embodiment shown in FIG. 4, the conductive member 130 is positioned adjacent to the second surface 152 of the microelectronic substrate 150, with the aperture 164 aligned with the bond pads 151. Accordingly, the lower portion 162 of the dielectric material 160 is positioned adjacent to the second surface 152 of the microelectronic substrate 150. A wire bond 140 or other connective element extends between selected bond pads 151 and corresponding bond regions 132 of the conductive portions 131 to provide conductive links between the microelectronic substrate 150 and the conductive member 130. The microelectronic substrate 150, the wire bonds 140, and the conductive portions 131 are then encapsulated with an encapsulating material 121 to form a device package 120. The connecting portion 138 (FIG. 2) of the conductive member 130 can then be trimmed, and external sections 139 of the conductive portions 131 outside the encapsulating material 121 can be shaped into connecting pins or other connecting structures.

Figure 1:
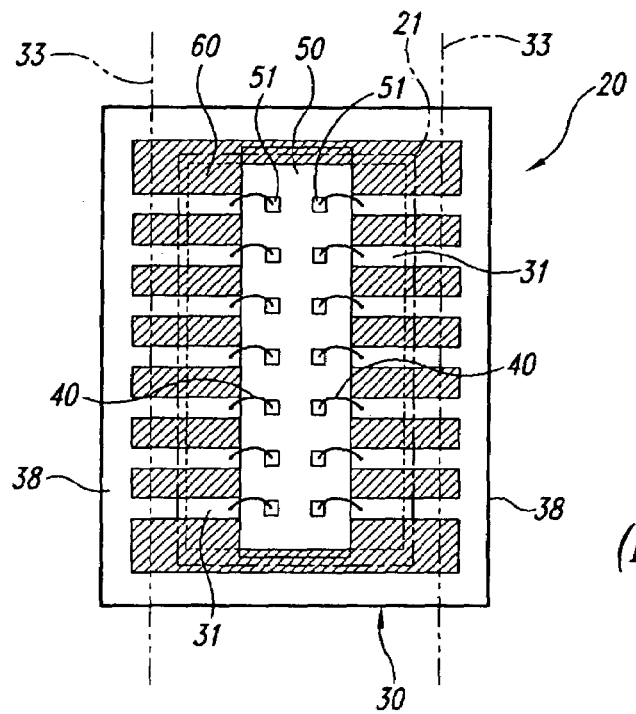
FIG. 1 is a partially schematic, top view of a microelectronic device package in accordance with the prior art.

One feature of an embodiment of the device package 120 and the conductive member 130 described above with reference to FIGS. 2–4 is that the dielectric material 160 adjacent to the conductive portions 131 can be selected to control capacitive coupling between neighboring conductive portions 131. For example, in one embodiment, the dielectric material 160 can include Teflon™ (polytetrafluoroethylene) and can have a dielectric constant of from approximately 1.0 to approximately 2.0. Accordingly, the likelihood for capacitive coupling between neighboring conductive portions 131 can be reduced when compared to conventional arrangements (such as the arrangement described above with reference to FIG. 1) that have relatively high dielectric encapsulating materials positioned between adjacent leadfingers. In other embodiments, the dielectric material 160 can have a dielectric constant higher than 2.0, but less than the dielectric constant of conventional encapsulating materials, which is approximately 3.5 and above.

An advantage of the relatively low dielectric constant of the dielectric material 160 is that signals transmitted along one conductive portion 131 will be less likely to affect signals transmitted along an adjacent conductive portion 131. Another advantage of this feature is that the conductive portions 131 can be positioned more closely together than in some conventional arrangements without capacitively coupling adjacent conductive portions 131. Accordingly, the conductive member 130 can be smaller than conventional leadframes and can be suitable for use with reduced-size microelectronic substrates 150.

Figure 5A:
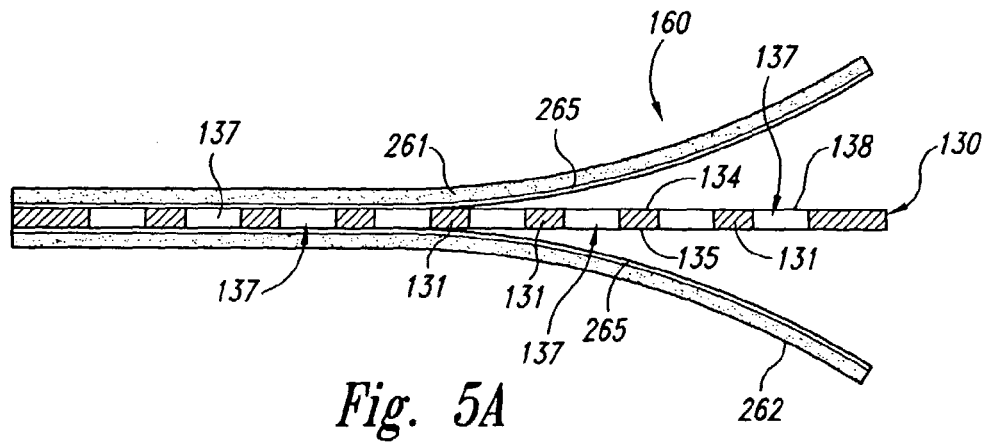
FIGS. 5A–5D illustrate methods for forming conductive members with dielectric materials in accordance with several embodiments of the invention.

FIGS. 5A–5D schematically illustrate processes for disposing dielectric materials on conductive members in accordance with several embodiments of the invention. Referring first to FIG. 5A, the dielectric material 160 can include a pliable upper layer 261 disposed adjacent to the upper surface 134 of the conductive member 130, and a pliable lower layer 262 disposed adjacent to the lower surface 135 of the conductive member 130. In a further aspect of this embodiment, each layer 261, 262 can include a low dielectric adhesive 265 that adheres the layer to the conductive member 130. Alternatively, the dielectric material 160 forming the layers 261, 262 can self-adhere to the conductive member 130. In either embodiment, the dielectric constant of the upper layer 261 can be the same as or different than the dielectric constant of the lower layer 262. In one embodiment, the dielectric material 160 can be a thermoset material that is cured after attaching it to the conductive member 130. In other embodiments, the dielectric material 160 can have other thermal characteristics.

In one aspect of an embodiment of the process shown in FIG. 5A, the layers 261, 262 do not initially extend into the intermediate regions 137 between neighboring conductive portions 131. Accordingly, in a further aspect of this embodiment (shown in FIG. 5B), pressure can be applied to the upper layer 261 and/or the lower layer 262 (as indicated by arrows P) to force at least a portion of the dielectric material 160 that forms the layers 261, 262 into the intermediate regions 137 between neighboring conductive portions 131. In one aspect of this embodiment, the dielectric material 160 can also be heated to encourage the movement of the dielectric material 160 into the intermediate regions 137, and/or to cure the dielectric material 160, for example, when the dielectric material 160 includes a thermoset material. Alternatively, the pressure can be applied to the dielectric material 160 at room temperature. In either embodiment, the pressure can be applied to the dielectric material 160 either before or after the conductive member 130 is positioned adjacent to the microelectronic substrate 150 (FIG. 4).

Figure 5B:
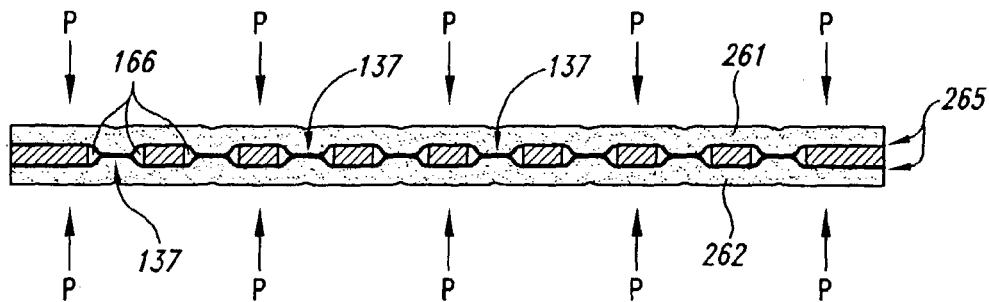

In one embodiment, the dielectric material 160 can fill only a portion of the intermediate regions 137. For example, as shown in FIG. 5B, voids 166 can remain in the intermediate regions 137 after pressure has been applied to the dielectric material 160. In a further aspect of this embodiment, the process described above with reference to FIG. 5B can be conducted in a controlled gas environment to control the nature of the gas residing in the voids 166. Accordingly, the gas can include air, helium, argon or other gases having a generally low dielectric constant. Alternatively, the dielectric material 160 can fill the intermediate regions 137 in their entirety (as shown in FIGS. 2 and 3). Accordingly, the thickness of the layers 261, 262 and the processing parameters described above can be selected to eliminate the voids 166.

An advantage of a process for forming the conductive member 130 described above with reference to FIGS. 5A–5B is that the layers 261, 262 of the conductive material 160 can be easily applied to the conductive member 130. For example, the layers 261, 262 can be formed into adhesive strips or pads separately from forming the conductive members 130, and can be applied to the conductive members 130 as needed. Alternatively, the layers 261, 262 can be applied to the conductive members 130 as part of the process for forming the conductive members 130, for example, by unrolling continuous strips of dielectric materials adjacent to opposite surfaces of a continuous strip of conductive members 130.

Figure 5C:
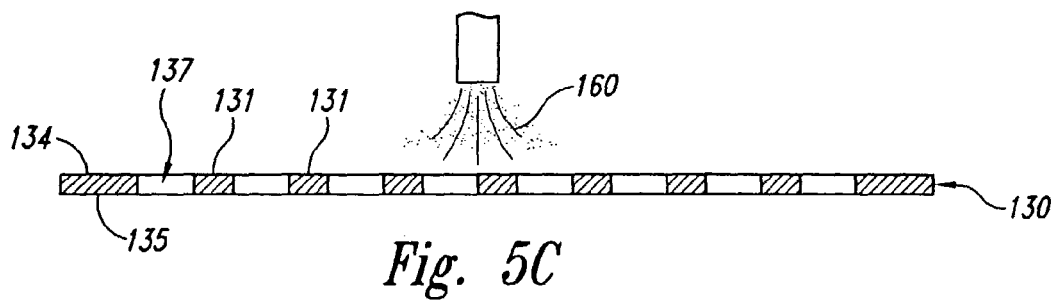

In an alternate embodiment shown schematically in FIG. 5C, the dielectric material 160 is disposed on the conductive member 130 in the form of a liquid or vapor using a deposition or spray process. Accordingly, the dielectric material 160 can conform to the features of the conductive member 130 and can entirely fill the intermediate regions 137 between neighboring conductive portions 131. In one aspect of this embodiment, the dielectric material 160 can be initially deposited adjacent to the upper surface 134 of the conductive member 130 and then deposited adjacent to the lower surface 135. Alternatively, both deposition processes can take place simultaneously.

In another aspect of an embodiment of the process described above with reference to FIG. 5C, at least a portion of the dielectric material 160 can be deposited on the conductive member 130 after the conductive member 130 has been mounted to the microelectronic substrate 150 (FIG. 4). For example, the dielectric material 160 can be deposited adjacent to the lower surface 135 of the conductive member 130, but not the upper surface 134. The conductive member 130, with the lower surface 135 covered with the dielectric material 160, can be positioned adjacent to the microelectronic substrate 150 and wire bonded to the microelectronic substrate 150, as described above with reference to FIG. 4. An additional amount of dielectric material 160 can then be deposited on the microelectronic substrate 150, the wire bond 140 and the upper surface 134 of the conductive member 130 to fill in the intermediate regions 137 between the neighboring conductive portions 131 and encapsulate the wire bonds 140. In a further aspect of this embodiment, the encapsulating material 121 described above with reference to FIG. 4 can be eliminated and the functions provided by the encapsulating material 121 (for example, protecting the microelectronic substrate 150 and the wire bonds 140 from contaminants) can be provided by the dielectric material 160 alone. An advantage of this arrangement is that the dielectric material 160 can prevent or control capacitive coupling between adjacent conductive portions 131 of the conductive member 130 and can protect and encapsulate the microelectronic substrate 150.

Figure 5D:
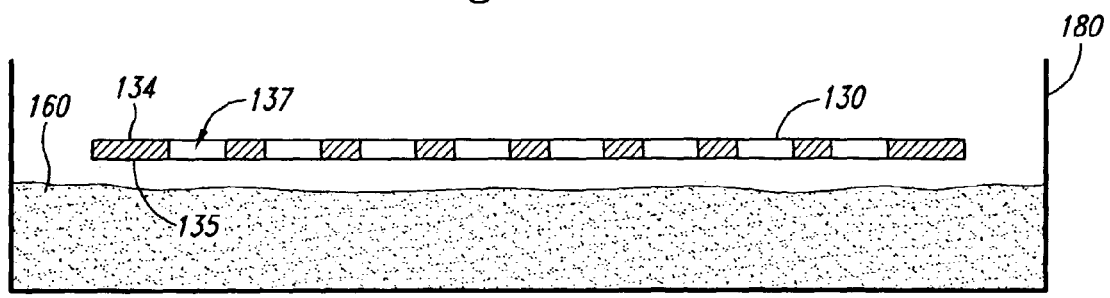

FIG. 5D schematically illustrates a process in accordance with yet another embodiment of the invention in which the conductive member 130 is dipped into a reservoir 180 containing the dielectric material 160. In one aspect of this embodiment, the entire conductive member 130 can be dipped into the dielectric material 160 to dispose the dielectric material in the intermediate regions 137 and adjacent to the upper surface 134 and the lower surface 135 of the conductive member 130. Alternatively, the conductive member 130 can be initially dipped into the reservoir 180 with the lower surface 135 facing the dielectric material 160, and subsequently inverted and re-dipped into the reservoir 180 with the upper surface 134 facing the dielectric material 160. In either embodiment, the dielectric material can be removed from the bond region 132 (FIG. 2) by etching or other processes. Alternatively, the bond regions 132 can be protected with a removable covering prior to dipping the conductive member 130 in the dielectric material 160.

Figure 6:
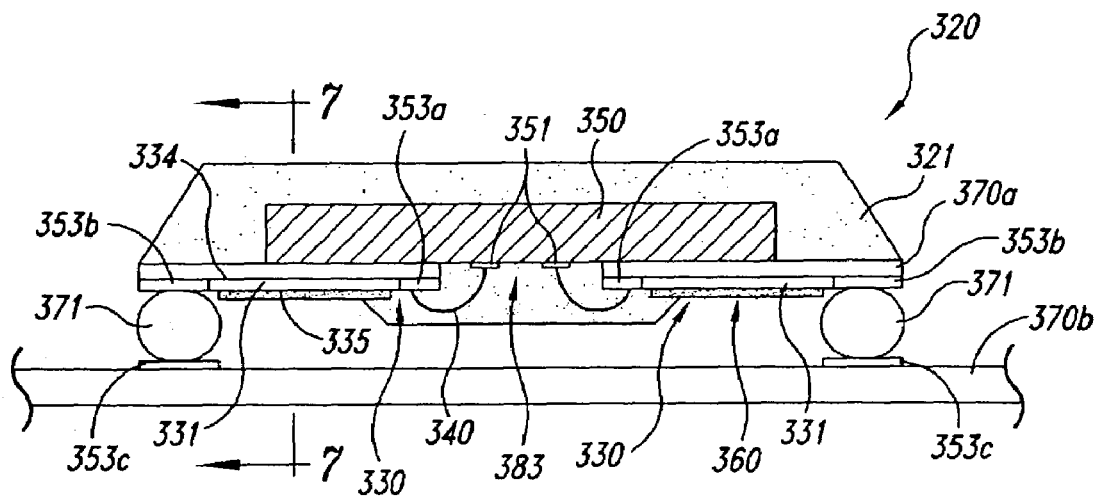
FIG. 6 is a cross-sectional end view of a microelectronic substrate coupled to a conductive assembly to form a device package in accordance with another embodiment of the invention.
Figure 7:
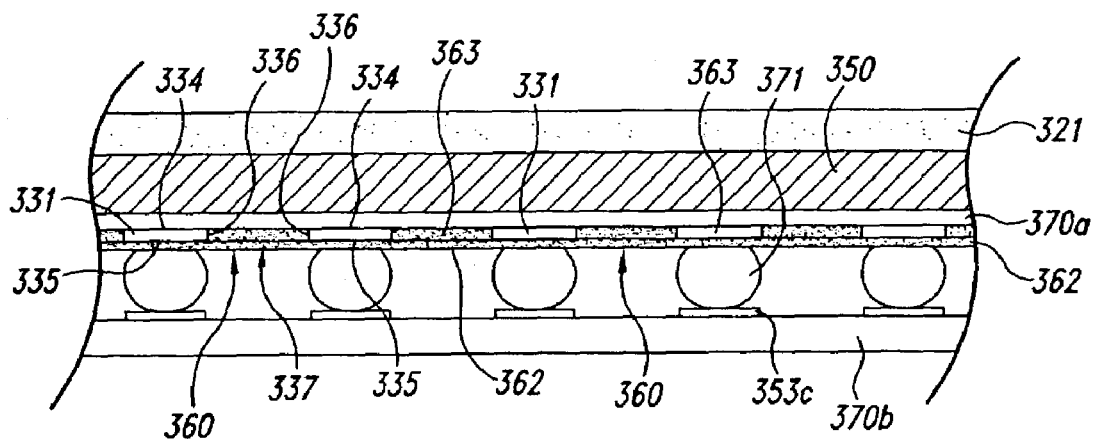
FIG. 7 is a cross-sectional side view of an embodiment of the package shown in FIG. 6 taken substantially along line 7—7.

FIG. 6 is a cross-sectional end view of a microelectronic substrate 350 coupled to a conductive assembly 330 to form a packaged device 320 in accordance with another embodiment of the invention. FIG. 7 is a cross-sectional side view of the package 320 taken substantially along line 7—7 of FIG. 6. Referring now to FIGS. 6 and 7, the microelectronic substrate 350 includes substrate bond pads 351 coupled to internal features (not shown). The microelectronic substrate 350 is supported by a package support member 370a, such as a printed circuit board (PCB) that includes an aperture 383 aligned with the substrate bond pads 351. The package support member 370a also includes a conductive assembly 330 facing away from the microelectronic substrate 350 and configured to be coupled to the substrate bond pads 351.

In one aspect of an embodiment shown in FIGS. 6 and 7, the conductive assembly 330 includes a network or array of conductive traces 331. The conductive traces 331 are connected between inner bond pads 353a adjacent to the aperture 383 and outer bond pads 353b. Wire bonds 340 are connected between the inner bond pads 353a and the substrate bond pads 351 to link the internal features of the microelectronic substrate 350 to the conductive assembly 330. The microelectronic substrate 350, the package support member 370a and the wire bonds 340 are at least partially encased in an encapsulating material 321 to form the packaged device 320. The packaged device 320 can be connected to another, larger support member 370b by coupling solder balls 371 between the outer bond pads 353b of the package support member 370a and corresponding bond pads 353c of the other support member 370b.

In one aspect of an embodiment shown in FIGS. 6 and 7, each trace 331 has an upper surface 334, a lower surface 335 opposite the upper surface 334, and a side surface 336 between the upper surface 334 and the lower surface 335. The side surfaces 336 of neighboring traces 331 are spaced apart to define intermediate regions 337. A dielectric material 360 can be positioned adjacent to the traces 331 to cover one or more of the surfaces of the traces 331. For example, in one embodiment, the dielectric material 360 can include a lower portion 362 adjacent to the lower surface 335 of the conductive traces 331, and an intermediate portion 363 in the intermediate region 337 between neighboring traces 331. The dielectric material 360 can also include an upper portion (not shown in FIGS. 6 and 7) positioned between the upper surface 334 of the traces 331 and the remainder of the package support member 370a.

In a further aspect of an embodiment shown in FIGS. 6 and 7, the lower portion 362 of the dielectric material 360 does not cover the inner bond pads 353a or the outer bond pads 353b allow for electrical coupling to these bond pads. Alternatively, the dielectric material 360 can initially cover the bond pads 353a, 353b and can then be locally removed from the bond pads for electrical coupling. In either embodiment, the dielectric material 360 can reduce the capacitive coupling between adjacent traces 331 by reducing the dielectric constant of the intermediate region 337 between neighboring traces 331. For example, in some conventional arrangements, a solder mask material having a dielectric constant of 3.5 or greater is positioned between neighboring traces 331. In one aspect of an embodiment shown in FIGS. 6 and 7, the dielectric material 360 can have a dielectric constant of less than 3.5, and in a specific embodiment, the dielectric material can be from about 1.0 to about 2.0.

In another aspect of an embodiment shown in FIGS. 6 and 7, the dielectric material 360 can fill less than the entirety of each intermediate region 337, leaving gaps that can be filled with air, helium, argon or another low-dielectric gas in a manner generally similar to that described above with reference to FIG. 5B. In still further embodiments, the dielectric material 360 can be disposed on the traces 331 in accordance with any of the methods described above with reference to FIGS. 2–5D. Accordingly, an advantage of any of the embodiments of the packaged device 320 shown in FIGS. 6 and 7 is that the likelihood for capacitive coupling between adjacent traces 331 can be reduced or eliminated.

From the foregoing, it will be appreciated that specific embodiments of the invention have been described herein for purposes of illustration, but various modifications may be made without deviating from the spirit and scope of the invention. Accordingly, the invention is not limited except by the appended claims.

The invention claimed is:

1. A method for packaging a microelectronic substrate, comprising:
   positioning a conductive member at least proximate to the microelectronic substrate, the conductive member having first and second neighboring conductive portions with at least part of the first conductive portion separated from the neighboring second conductive portion to define an intermediate region between the conductive portions;
   electrically coupling the first conductive portion of the conductive member to a first coupling site of the microelectronic substrate and electrically coupling the second conductive portion of the conductive member to a second coupling site of the microelectronic substrate; and
   providing a dielectric material in the intermediate region between the conductive portions, the dielectric material including argon and/or helium.

2. The method of claim 1 wherein the conductive portions each have a first surface adjacent to the microelectronic substrate, a second surface facing opposite the first surface, and a third surface between the first and second surfaces, and wherein the method further comprises providing the dielectric material adjacent to the third surfaces of the conductive portions.

3. The method of claim 1 wherein the conductive portions each have a first surface adjacent to the microelectronic substrate, a second surface facing opposite the first surface, and a third surface between the first and second surfaces, and wherein the method further comprises disposing the dielectric material on the second surfaces of the conductive portions and applying a force normal to the second surface to displace at least some of the dielectric material into the intermediate region between the conductive portions adjacent to the third surfaces of the conductive portions.

4. The method of claim 1 wherein positioning the conductive member includes positioning a leadframe adjacent to the microelectronic substrate, and wherein the method further comprises providing the dielectric material between neighboring leadfingers of the leadframe.

5. The method of claim 1 wherein positioning the conductive member includes positioning adjacent to the microelectronic substrate a printed circuit board having conductive traces, and wherein the method further comprises providing the dielectric material between the conductive traces of the printed circuit board.

6. The method of claim 1, further comprising adhering a layer of the dielectric material to the conductive member.

7. The method of claim 1, further comprising:
   disposing the dielectric material on the conductive member; and
   applying heat and/or pressure to the dielectric material after disposing the dielectric material on the conductive member.

8. The method of claim 1, further comprising disposing the dielectric material on the conductive member in a liquid or vapor phase.

9. The method of claim 1 wherein electrically coupling the conductive portions of the conductive member to coupling sites of the microelectronic substrate includes attaching wire bonds between the conductive portions of the conductive member and bond pads of the microelectronic substrate.

10. The method of claim 1, further comprising disposing an encapsulating material over at least part of the conductive member and the microelectronic substrate.

11. The method of claim 1, further comprising selecting the dielectric constant of the dielectric material to be from about 1.0 to about 2.0.

12. The method of claim 1, further comprising selecting the dielectric material to include polytetrafluoroethylene.

13. A method for processing a circuit board for coupling to a microelectronic substrate, comprising:
   providing a circuit board having a first conductive trace with a portion spaced apart from a corresponding portion of a second conductive trace to define an intermediate region between the first and second conductive traces;

disposing in the intermediate region between the conductive traces a dielectric material; and selecting the dielectric material to include argon and/or helium.

14. The method of claim 13, further comprising selecting the dielectric material to have a dielectric constant of from about 1.0 to about 2.0.

15. A method for packaging a microelectronic substrate, comprising:

positioning leadfingers of a leadframe adjacent to corresponding bond sites of the microelectronic substrate;

disposing a first dielectric material adjacent to first surfaces of the leadfingers and the microelectronic substrate;

disposing a second dielectric material adjacent to second surfaces of the leadfingers facing opposite the first surfaces;

removing a portion of the second dielectric material from the second surface of each leadfinger to expose a portion of the second surface of each leadfinger;

electrically coupling the leadfingers to the bond sites by attaching wire bonds between the exposed portions of the leadfingers and the bond pads; and introducing at least some of the first and/or second dielectric material into a gap between adjacent leadfingers by biasing the leadframe toward the microelectronic substrate and/or applying heat to at least one of the dielectric materials.

16. The method of claim 15, further comprising disposing at least some of the first and/or second dielectric material in a liquid or vapor phase into a gap between adjacent leadfingers.

17. The method of claim 15, further comprising disposing an encapsulating material over at least part of the leadframe and the microelectronic substrate.

18. The method of claim 15, further comprising selecting the dielectric constant of the first and/or second dielectric material to be from about 1.0 to about 2.0.

19. The method of claim 15, further comprising selecting the first and/or second dielectric material to include polytetrafluoroethylene.

20. The method of claim 15, further comprising selecting the first and/or second dielectric material to include a gas.

21. The method of claim 15, further comprising selecting the first and/or second dielectric material to include argon and/or helium.

* * * * *